(12) United States Patent
Davies et al.

(10) Patent No.: US 6,396,688 B1
(45) Date of Patent: May 28, 2002

(54) SERIES FAN SPEED CONTROL SYSTEM

(75) Inventors: Stephen J. Davies, Leander; Jil M. Bobbitt, Austin; Jason D. Tunnell, Georgetown, all of TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/537,159

(22) Filed: Mar. 29, 2000

(51) Int. Cl.[7] ............................. G06F 1/20; H05K 5/00
(52) U.S. Cl. ........................................ 361/687; 361/51
(58) Field of Search ................................... 361/687, 51

(56) References Cited

U.S. PATENT DOCUMENTS

| | | | |
|---|---|---|---|
| 5,136,465 A | 8/1992 | Benck et al. ............... | 361/687 |
| 5,168,424 A | 12/1992 | Bolton et al. ............... | 361/695 |
| 5,249,741 A | 10/1993 | Bistline et al. ............. | 236/49.3 |
| 5,287,244 A | 2/1994 | Hileman et al. ............ | 361/687 |
| 5,339,214 A | 8/1994 | Nelson ........................ | 361/695 |
| 5,528,454 A | 6/1996 | Niklos ........................ | 361/695 |
| 5,546,272 A | 8/1996 | Moss et al. ................. | 361/687 |
| 5,687,079 A | 11/1997 | Bauer et al. ................ | 361/695 |
| 5,761,085 A * | 6/1998 | Giorgio ...................... | 361/687 |
| 5,778,081 A | 7/1998 | Patrick ...................... | 381/71.5 |
| 5,791,869 A | 8/1998 | Lee ............................. | 415/119 |
| 5,963,887 A * | 10/1999 | Giorgio ...................... | 361/687 |
| 6,101,459 A * | 8/2000 | Tavallaei et al. ........... | 702/132 |

* cited by examiner

*Primary Examiner*—Jessica Han
*Assistant Examiner*—Pia Tibbits
(74) *Attorney, Agent, or Firm*—Haynes and Boone, LLP

(57) ABSTRACT

A redundant fan system includes an in-series configuration of adjustable speed fans. A speed controller coupled to the fan system includes a first fan operated at a constant operating speed and a second fan operated at an adjusted operating speed to maintain a speed differential between the first and second fan speeds. A sensing device is connected to the first and second fans and to the speed controller for maintaining the speed differential constant.

19 Claims, 5 Drawing Sheets

SERIES FAN SPEED CONTROL SYSTEM

BACKGROUND

The disclosures herein relate generally to multiple fan systems. More particularly, the disclosures herein relate to series configuration multiple fan speed control systems for computers.

Multiple fans in a series configuration are often used in redundant fan systems. A stream of air from an upstream fan feeds into the inlet of a downstream fan. Typically, both fans are selected to have the same specification and are intended to operate at the same speed. In such a series redundant fan system including two fans, both fans are operated at a part-speed level when both fans are operational. When one of the fans fails or is otherwise made inoperable, the other fan is switched to a higher speed operation, such as a full-speed level, ensuring that sufficient air delivery is provided by the single fan.

U.S. Pat. No. 5,687,079 discloses a computer having a plurality of electrically powered fans and an I/O port to produce a fan speed control signal for each fan. The computer includes a fan-speed-control device and measures air temperature and controls fan speed as a function of the air temperature. The fan control device varies each fan speed in response to the different control signals generated by the port such that the fans are operated at different speeds to limit acoustical noise associated with the beat frequency of the fans.

U.S. Pat. No. 5,546,272 discloses a cooling subsystem including a first fan and a second fan. A common plenum provides a shrouded pathway for air communication between the first and second fans. The first and second fans cooperate to provide an optimum rate of ambient air flow into the chassis to provide air exchange within the chassis. The air flow within the chassis is in a predetermined direction to provide directed cooling of a specified device within the chassis. Both of the fans are operated at a low-speed level to provide a minimum air flow and a minimum air exchange within the chassis. Upon failure of one of the fans, the other one of the fans is automatically switched from the low-speed level to a higher speed level.

U.S. Pat. 5,168,424 discloses an apparatus including one or more electrical devices. Each one of the electrical devices is located in a corresponding one of a plurality of positions defined in a first section of a housing. The system further includes at least one dual side entry fan positioned such that each side entry is opposite a device and a power supply unit. In operation, the fans provide forced air cooling of the devices and power supply. Each of the devices is selected from a plurality of possible types with each type presenting a different impedance to the flow of cooling air.

Even though the fans in a system are made to the same specification and are made by the same manufacturer, they will typically not operate at exactly the same speed. Variations in the operating speed of a fan can result from factors such as manufacturing tolerances, different applied voltages and fan circuit driver variations. The volumetric flow efficiency of two fans in a series fan system is adversely affected when the speeds of the fans are not maintained at a prescribed speed differential. For example, when the upstream fan operates at a speed level lower than the speed of the downstream fan, a pressure drop across the downstream fan results. The pressure drop causes reduced volumetric efficiency, decreasing the air flow output from the fan system relative to an optimized airflow output for the same fan system.

Accordingly, what is needed is a fan control circuit for use with series-configuration multiple fan systems that actively controls the speed of the fans to enhance the volumetric air flow efficiency of the fan system.

SUMMARY

One embodiment, accordingly, provides a cost-effective fan control system that tracks the speed of a plurality of fans mounted in a series configuration and that actively adjusts the speed of at least one of the fans. To this end, a cooling system for an electronic device includes a redundant fan system having an in-series configuration of adjustable speed fans. A speed controller is coupled to the fan system including a first fan operated at a constant speed and a second fan operated at an adjusted speed to maintain a speed differential between the operating speed of the first fan and the operating speed of the second fan. A sensing device is connected to the fans and to the speed controller for maintaining the speed differential constant.

A principal advantage of this embodiment is that the volumetric flow efficiency of the fan system is improved.

BRIEF DESCRIPTION OF THE DRAWING FIGURES

DETAILED DESCRIPTION

Figure 1:
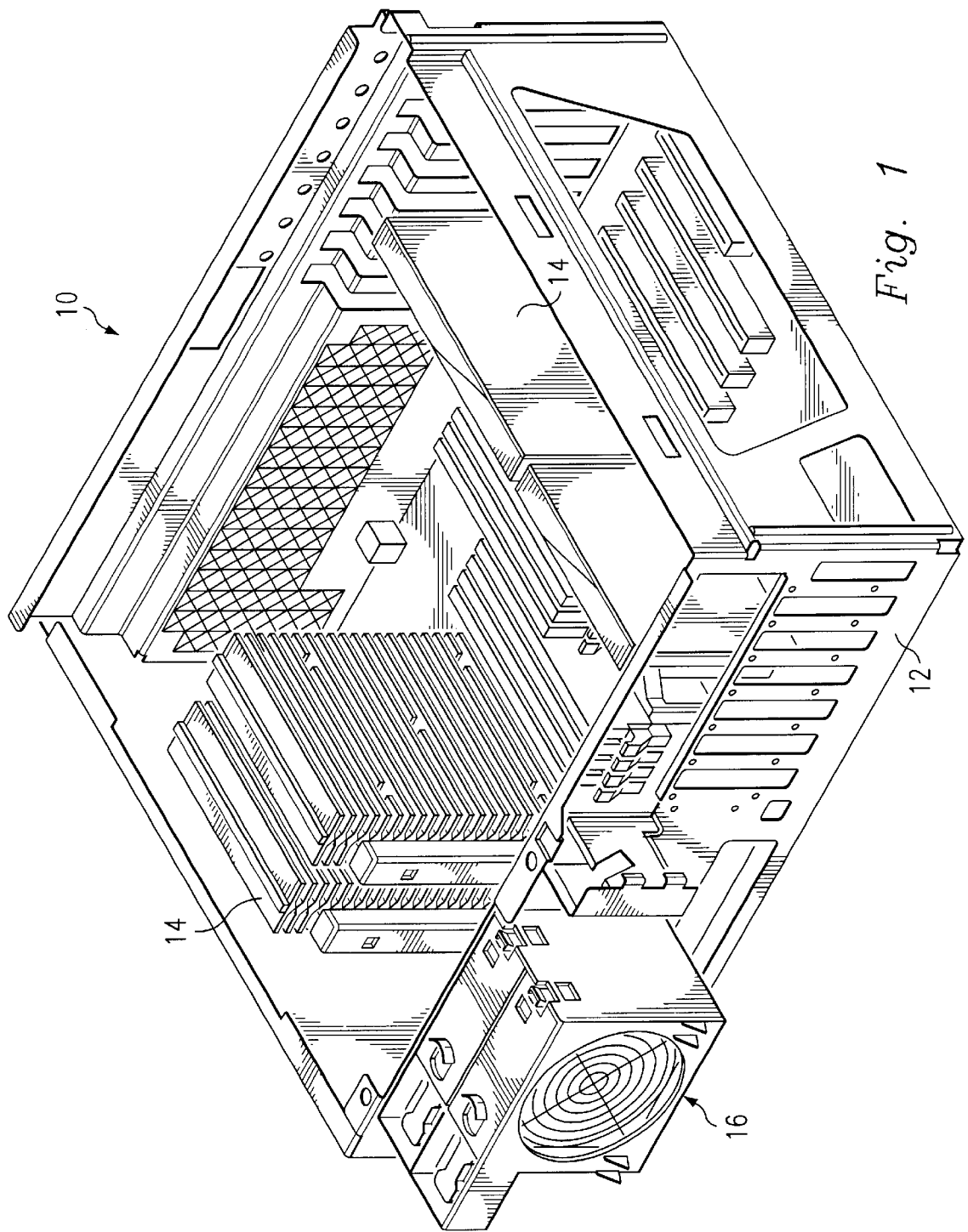
FIG. 1 is a perspective view illustrating an embodiment of an electronic apparatus including a fan assembly.

An embodiment of an electronic apparatus 10, such as a computer, is illustrated in FIG. 1. The apparatus 10 includes a chassis 12 having a plurality of heat generating components 14 mounted therein. A fan assembly 16 is mounted on the chassis 12 for providing forced air flow through the chassis 12 for cooling the heat generating components 14 mounted therein.

Figure 2:
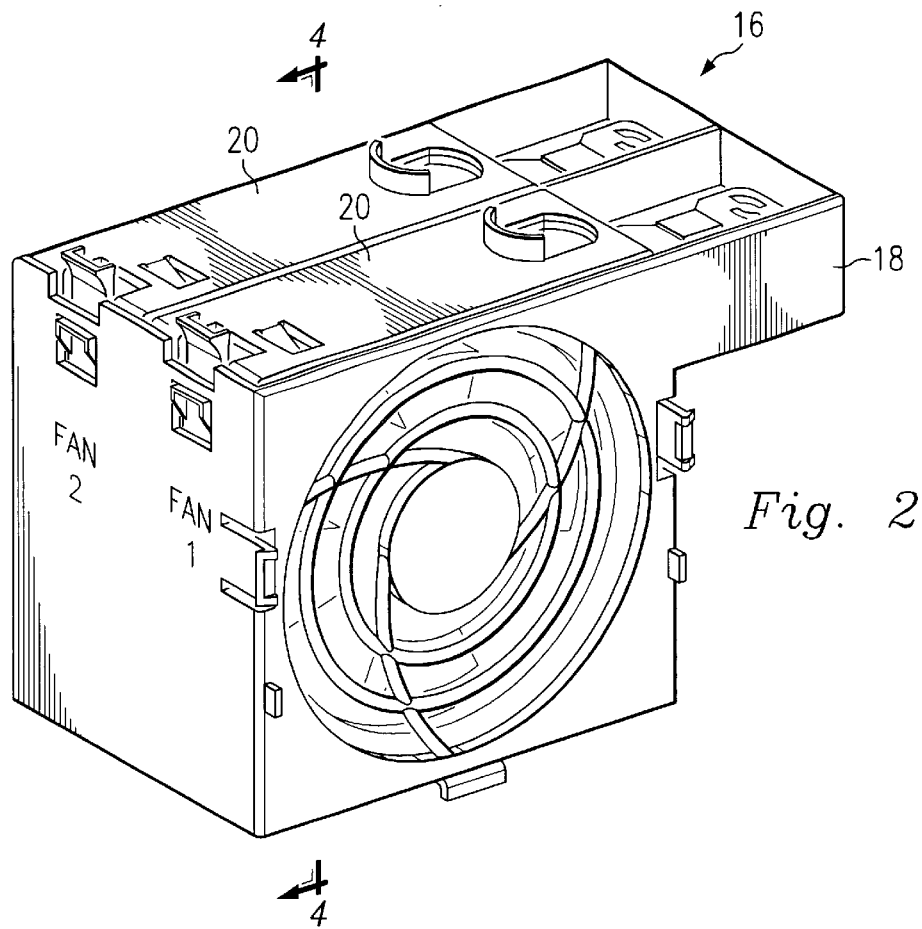
FIG. 2 is a perspective view illustrating an embodiment of a fan assembly.
Figure 3:
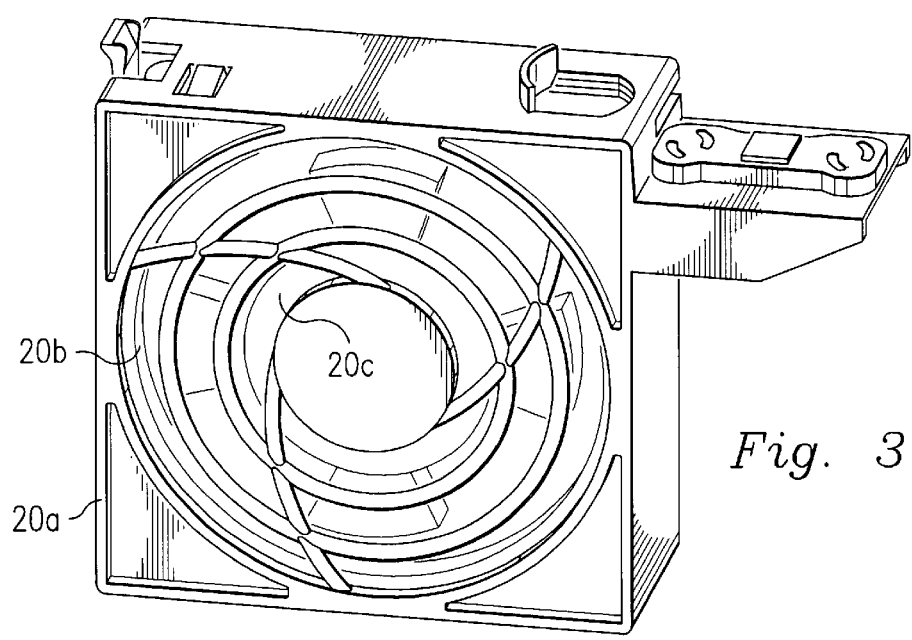
FIG. 3 is a perspective view illustrating an embodiment of a fan.
Figure 4:
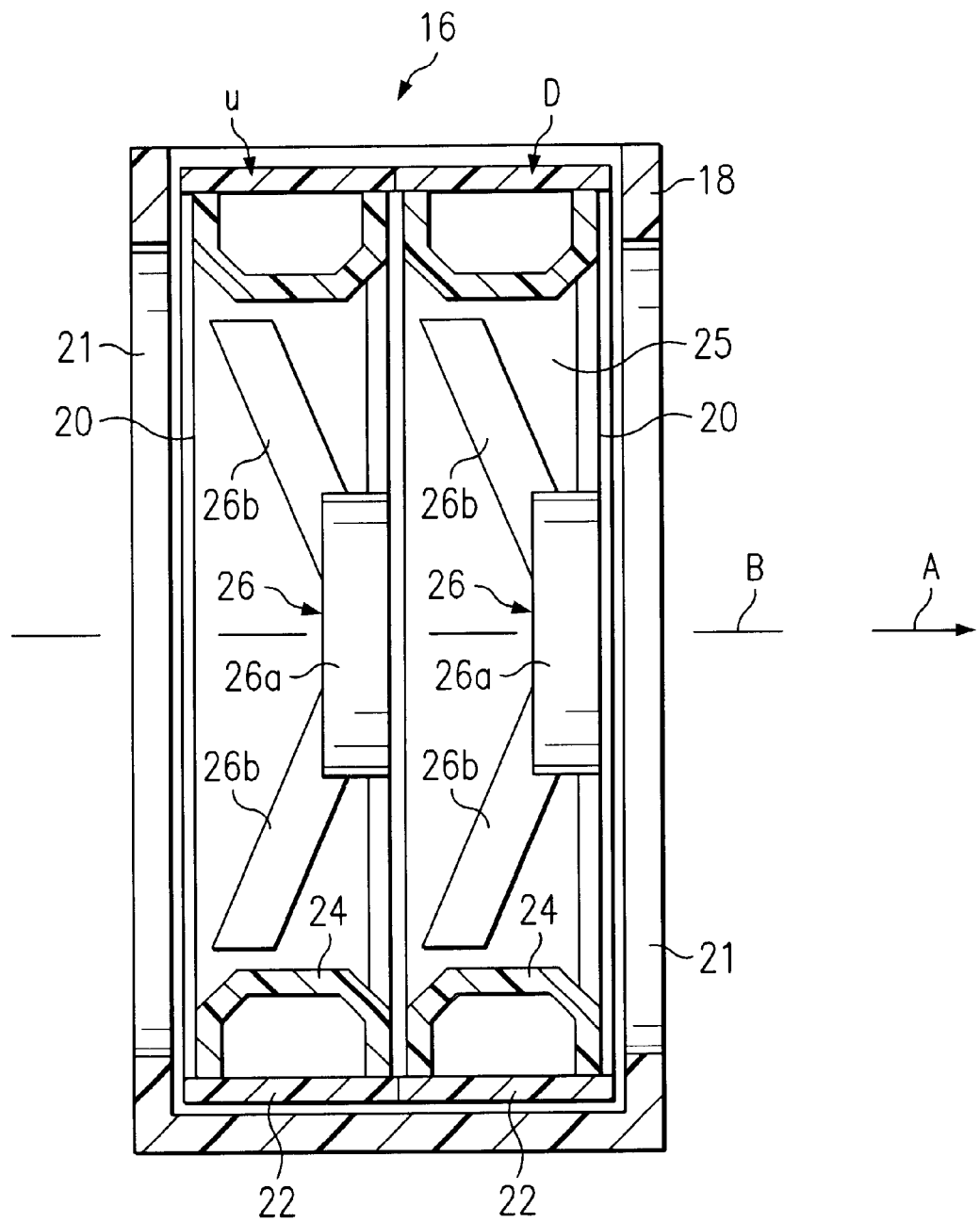
FIG. 4 is cross-sectional side view taken along the line 4–4 in FIG. 2.

Referring now to FIGS. 2–4, the fan assembly 16 includes a fan housing 18, FIGS. 2 and 4. A plurality of fans 20 are removably mounted in the fan housing 18. A suitable fan is commercially available from Nidec Corporation, sold under the Series No. TA450DC and Model Number B31256. Although two fans 20 are illustrated, the fan housing 18 may be configured to accept more than two fans. The fan housing 18 includes a plurality of openings 21, FIG. 4, for permitting air flow to and from the fans 20.

It is desirable to removably mount the fans 20 in the fan housing 18 such that they can be removed and replaced. A backup or redundant fan configuration is desirable in many applications, such as server-type computers, to permit a failed or otherwise inoperable fan to be replaced while the remaining fan or fans continue to provide cooling.

Each one of the fans 20, FIGS. 3 and 4, includes a frame 22, a shroud 24 mounted in the frame 22, and a motor assembly 26 attached to the shroud 24. In a side-by-side series configuration, such as that illustrated in FIGS. 2 and 4, the shrouds 24 of the two fans 20 define an air duct 25 for routing air therethrough. The motor assembly 26 typically includes an electric motor 26a, FIG. 4, with a plurality of blades 26b attached thereto for being rotated by the electric motor 26a.

As illustrated in FIG. 4, each fan 20 is oriented in the fan housing 18 for directing a stream of air through the respective air duct 25. The streams of air provided by each fan 20 are directed in a common air flow direction designated A along an air flow axis designated B. An important aspect of the embodiment disclosed is that the fans are mounted in a series configuration. In such a series redundant configuration, the stream of air provided by the fan 20 in an upstream position designated U is imparted upon the fan 20 in a downstream position designated D, FIG. 4. In the event that one of the fans 20 fails or otherwise becomes inoperable, the remaining operable fan continues to operate for providing air flow to cool the heat generating components 14.

Series mounted fans are preferred in many applications, such as redundant and hot-pluggable applications. In a typical redundant fan system including two fans, both of the fans are operated at part speed during normal operation. When one of the fans becomes inoperable, the remaining operable fan is switched to a higher speed operation such that the volumetric air flow provided by the fan system remains approximately the same as with both of the fans being operable.

However, fans mounted in a series configuration are known to provide less than optimal volumetric air flow efficiency when the fan in the upstream position U is operated at a speed level less than speed level of the fan in the downstream position D. Such a negative speed differential results in a pressure drop across the fan in the downstream position D.

To enhance the volumetric flow characteristics of a series fan system, it is desirable to reduce or eliminate such a pressure drop across the fan in the downstream position D. One technique for controlling the pressure drop across the fan in the downstream position D is to maintain the speed level of the fan in the upstream position U at a speed level higher than the speed level of the fan in the downstream position D. By doing so, the pressure drop can be significantly reduced, if not eliminated.

Figure 5:
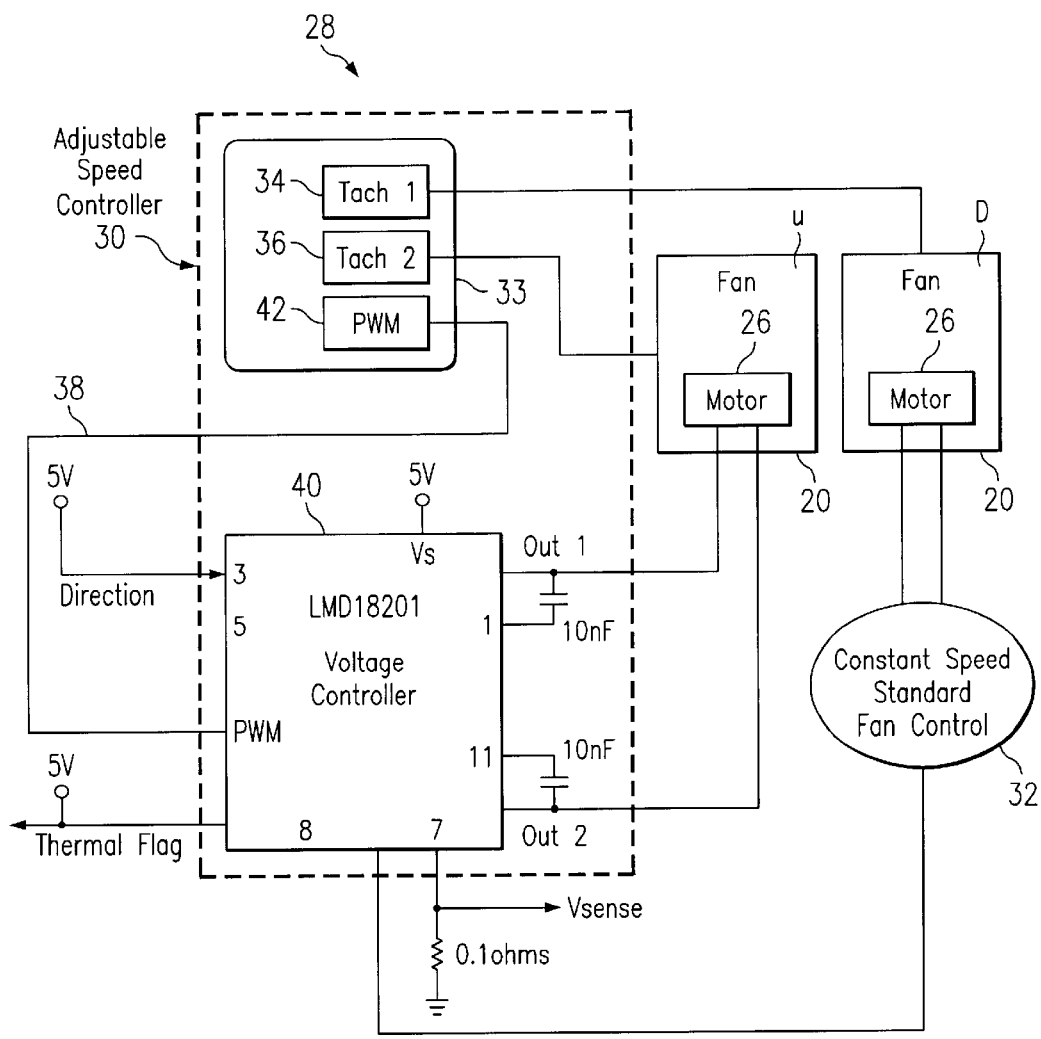
FIG. 5 is a block diagram view illustrating an embodiment of fan system control circuit.

An embodiment of a fan system control circuit 28 is illustrated in FIG. 5. The fan system control circuit 28 includes an adjustable speed fan controller 30 and a constant speed controller 32. The constant speed fan controller 32, such as a commercially available fan controller, is electrically connected to the motor assembly 26 of the fan 20 in the downstream position D. The adjustable speed fan controller 30 includes a speed sensing unit 33. The speed sensing unit 33 includes a first speed sensing device 34 attached to the fan 20 in the upstream position U and a second speed sensing device 36 attached to the fan 20 in the downstream position D. In a preferred embodiment, the speed sensing devices 34, 36 are commercially available tachometers or another type of rotating speed sensing device attached to each one of the fans 20 for monitoring the respective rotating fan speeds.

The adjustable speed fan controller 30 includes a voltage controller 40 electrically connected to the motor assembly 26 of the fan 20 in the upstream position U. A pulse width modulation signal 38 is communicated between a pulse width modulation device 42 of the speed sensing unit 33 and the voltage controller 40 of the adjustable speed fan controller 30. The pulse width modulation signal 38 is used by the voltage controller 40 to control a duty-cycle of the voltage supplied to the motor assembly 26 of the fan 20 in the upstream position U. Modulation of the duty cycle controls the percent on-time of voltage to the fan 20 in the upstream position U such that the speed can be adjusted.

A prescribed speed differential between the fan 20 in the upstream position U and the fan 20 in the downstream position D is maintained by actively adjusting the duty-cycle of the voltage supplied to the fan 20 in the upstream position U. The magnitude of the speed differential between the fan 20 in the upstream position U and the fan 20 in the downstream position D will be dependent on factors such as the type of fan, the configuration of the air directing structure extending between the two fans, and the fan blade configuration. The duty-cycle is adjusted in relation to the measured operating speed of the fan 20 in the downstream position D. Accordingly, variables such as manufacturing tolerances and voltage levels that affect the speed at which the fans 20 operate are actively compensated for by the duty-cycle of the voltage supplied to the fan 20 in the upstream position U.

Figure 6:
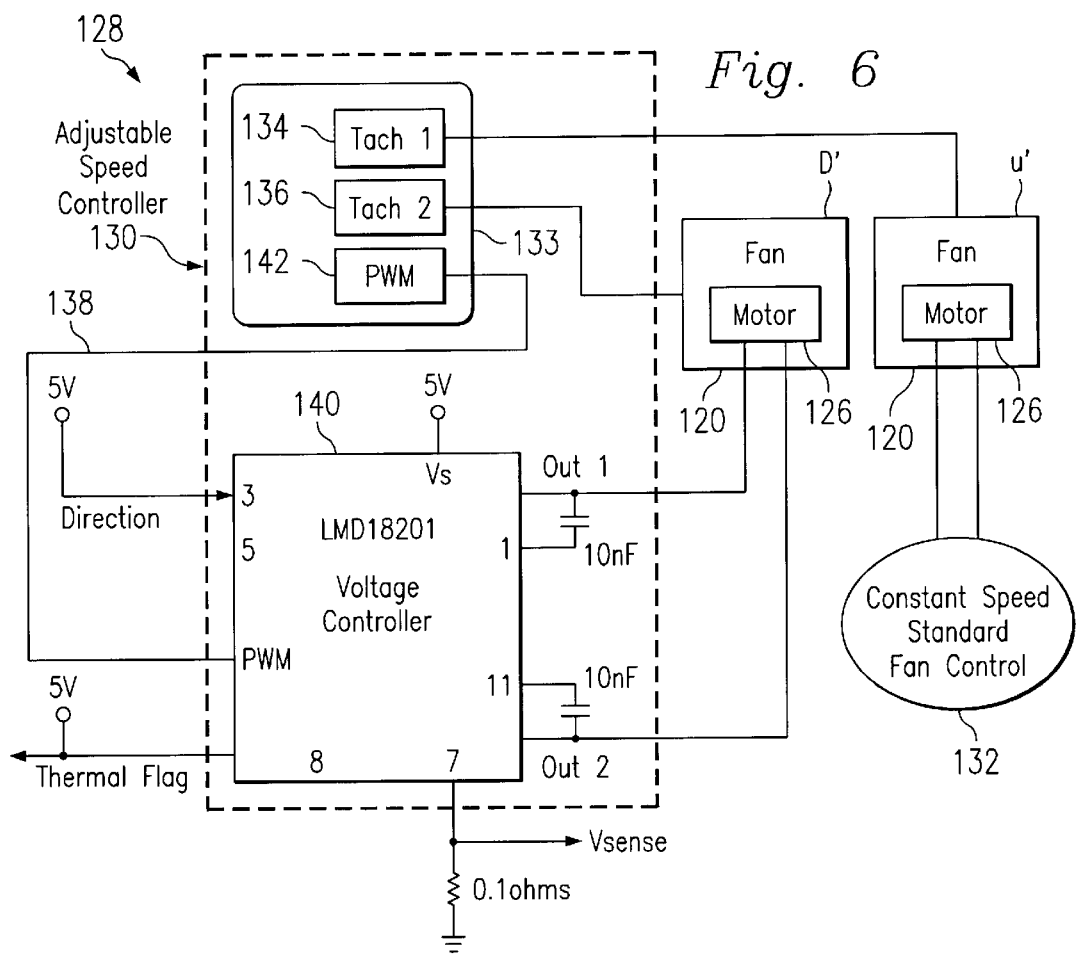
FIG. 6 is a block diagram view illustrating another embodiment of a fan system control circuit.

Referring now to FIG. 6, another embodiment of a fan system control circuit 128 is illustrated. In this embodiment, the operating speed of a fan 120 in a downstream position D' is adjusted in relationship to the operating speed of a fan 120 in an upstream position U'. The control circuit 128 includes an adjustable speed fan controller 130 and a constant speed controller 132. The constant speed fan controller 132, such as a commercially. available fan controller, is electrically connected to the motor assembly 126 of the fan 120 in the upstream position U'. The adjustable speed fan controller 130 includes a speed sensing unit 133. The speed sensing unit 133 includes a first speed sensing device 134 attached to the fan 120 in the downstream position D' and a second speed sensing device 136 attached to the fan 120 in the upstream position U'. In a preferred embodiment, the speed sensing devices 134, 136 are commercially available tachometers or another type of rotating speed sensing device attached to each one of the fans 120 for monitoring the respective rotating speeds.

The adjustable speed fan controller 130 includes a voltage controller 140 electrically connected to the motor assembly 126 of the fan 120 in the downstream position D'. A pulse width modulation signal 138 is communicated between a pulse width modulation device 142 of the speed sensing unit 133 and the voltage controller 140 of the adjustable speed fan controller 130. The pulse width modulation signal 138 is used by the voltage controller 140 to control a duty-cycle of the voltage supplied to the motor 126 of the fan 120 in the downstream position D'. Modulation of the duty cycle controls the percent on-time of voltage to the fan 120 in the downstream position D' such that the speed can be adjusted.

A prescribed speed differential between the fan 120 in the upstream position U' and the fan 120 in the downstream position D' is maintained by actively adjusting the duty-cycle of the voltage supplied to the fan 120 in the downstream position D'. The magnitude of the speed differential between the fan 120 in the upstream position U' and the fan 120 in the downstream position D' is dependent on factors such as the type of fan, the configuration of the air directing structure extending between the two fans, and the type of fan blade configuration. The duty-cycle is adjusted in relation to the measured operating speed of the fan 120 in the upstream position U'.

The fan systems disclosed herein may be used to provide redundant fan operation. In such an embodiment, the adjustable speed controller and the constant speed controller are configured to operate the fans at a lower speed level and at a higher speed level. Under normal operating conditions, the fans are operated at the lower speed level. When inoperability of either of the fans is sensed by the speed sensing unit, such as when the operating speed of one of the fans drops below a prescribed minimum speed level, the remaining operable fan is switched to the higher speed level to ensure that the volumetric flow provided by the fan system remains approximately the same as with both of the fans being operable.

Figure 7:
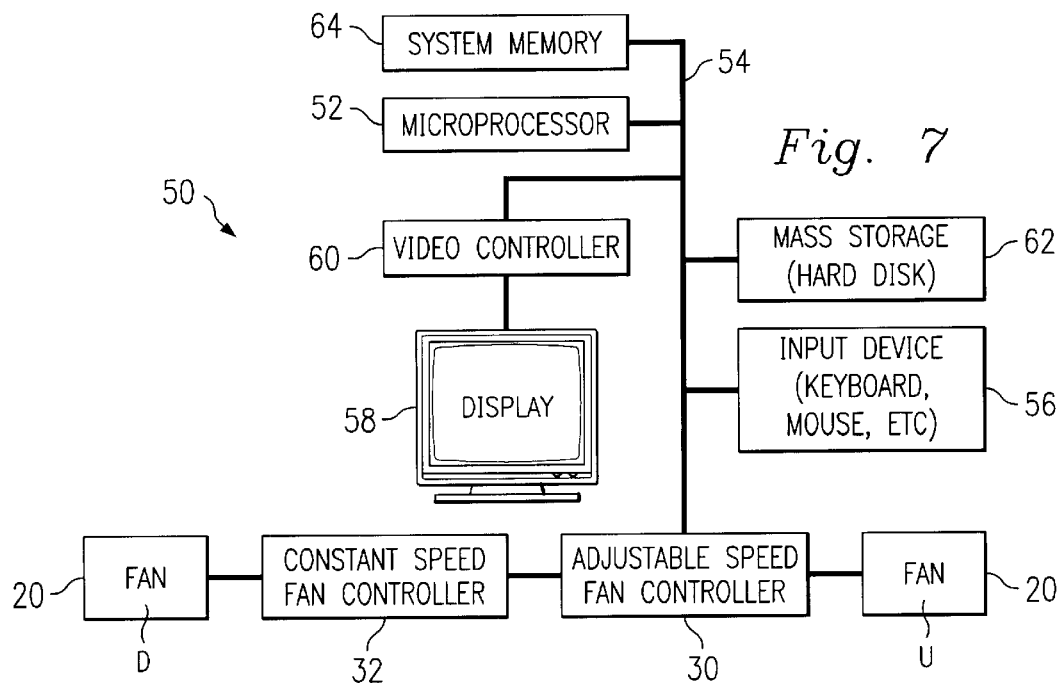
FIG. 7 is a block diagram view illustrating an embodiment of a fan cooled computer system.

An embodiment of a computer system 50 is illustrated in FIG. 7. The computer system 50 includes a microprocessor 52. The microprocessor 52 is connected to a bus 54 that serves as a connection between the microprocessor 52 and other components of the computer system 50. One or more input devices 56 may be coupled to the microprocessor 52 to provide input to the microprocessor 52. Examples of input devices include keyboards, touchscreens, and pointing devices such as a mouse, a trackball and a trackpad. The computer system 50 may also include a display 58 which is coupled to the microprocessor 52 by a video controller 60. Programs and data are stored on a mass storage device 62 which is coupled to the microprocessor 52. Mass storage devices include components such as hard disks, optical disks, magneto-optical drives, floppy drives, and the like. A system memory 64 provides the microprocessor 52 with fast storage to facilitate execution of computer programs by the microprocessor 52. It should be understood that other busses and intermediate circuits can be employed between the components described above and microprocessor 52 to facilitate interconnection between the components and the microprocessor 52.

Still referring to FIG. 7, the constant speed fan controller 32 and the adjustable speed fan controller 30 are coupled to the microprocessor 52. As discussed above, the adjustable speed fan controller 30 senses the inoperability of one or both of the fans 20. In the event that one or both of the fans 20 becomes inoperable, the adjustable speed fan controller 30 may communicate with the microprocessor 52 to initiate any number of safeguard actions. For example, in the event that one of the fans 20 becomes inoperable, the operating speed of the microprocessor 52 may be switched to a lower level, if needed, to prevent overheating of the microprocessor 52. In the event that both of the fans 20 become inoperable, the operation of the microprocessor 52 may be suspended until at least one of the fans 20 resumes operation.

As a result, one embodiment provides a cooling system for an electronic device. A redundant fan system includes an in-series configuration of adjustable speed fans. A speed controller coupled to the fan system includes a first fan operated at a constant operating speed and a second fan operated at an adjusted operating speed to maintain a speed differential between the first and second fan speeds. A sensing device is connected to the first and second fans and to the speed controller for maintaining the speed differential constant.

Another embodiment provides a computer system including a chassis having a microprocessor mounted thereon. A system memory is coupled to provide storage to facilitate execution of computer programs by the microprocessor. An input is coupled to provide input to the microprocessor. A display is coupled to the microprocessor by a video controller. A mass storage is coupled to the microprocessor. A redundant fan system includes an in-series configuration of adjustable speed fans. A speed controller coupled to the fan system includes a first fan operated at a constant operating speed and a second fan operated at an adjusted operating speed to maintain a speed differential between the first and second fan speeds. A sensing device is connected to the first and second fans and to the speed controller for maintaining the speed differential constant.

A further embodiment provides a method of operating a plurality of series mounted fans. A first fan and a second fan are mounted in a series configuration with each fan positioned to direct a respective stream of air in a common air flow direction along a common air flow axis. A speed controller is electrically connected to the fans. A first one of the fans is operated at a first generally constant operating speed. A second one of the fans is operated at an adjustable operating speed for maintaining a speed differential between the operating speed of the first fan and the operating speed of the second fan. One of the fans is operated at a second substantially constant operating speed in response to the other fan becoming inoperable. The second constant operating speed is a higher speed than the first constant operating speed.

For example, two commercially available fans sold by Nidec Corporation under the Series No. TA450DC and Model Number B31256 were mounted in a series configuration. The outlet of a first fan was mounted adjacent to the inlet of a second fan. A pressure measuring device was positioned to qualitatively measure the pressure across the second fan. A minimized pressure across the second fan was attained when the first fan was operated at a speed level approximately 3% higher than the speed level of the second fan.

As it can be seen, the embodiments disclosed herein provide several advantages. The volumetric air flow efficiency of the fan system is improved. The prescribed speed differential may be precisely maintained. Variables, such as manufacturing tolerances, that affect the operating speeds of the fans are compensated for by the speed controller. The required air flow volume for a given application is maintained even when one of the fans becomes inoperable.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A cooling system for an electronic device, comprising:
   a first fan for moving a stream of air;
   a second fan mounted adjacent the first fan for moving the stream of air;
   a constant speed controller electrically connected to one of the first and second fans;
   an adjustable speed controller including a first speed sensing device and a voltage controller electrically connected to one of the first and second fans, and a second speed sensing device electrically connected to the other of the first and second fans; and
   a speed differential between the first and second fans being maintained in response to adjusting voltage supplied to one of the first and second fans such that one of the fans, being in an upstream position relative to the stream of air, is speed adjusted to a speed level higher than the other of the fans.

2. The system of claim 1 wherein the first fan is in an upstream position and the second fan is in a downstream position relative to the stream of air.

3. The system of claim 2 wherein the constant speed controller is connected to the second fan.

4. The system of claim 2 wherein the first fan is adjusted to operate at a second substantially constant operating speed in response to the second fan becoming inoperable, the second constant operating speed being a higher speed than a first constant operating speed.

5. The system of claim 4 wherein the first constant operating speed is approximately one-half of the second constant operating speed.

6. The system of claim 3 wherein the first speed sensing device and the voltage controller are connected to the first fan, and the second speed sensing device is connected to the second fan.

7. The system of claim 6 wherein the first fan is speed adjusted to a speed level higher than the constant speed of the second fan.

8. The system in claim 1 wherein the first fan is in a downstream position and the second fan is in an upstream position relative to the stream of air.

9. The system of claim 8 wherein the constant speed controller is connected to the first fan.

10. The system of claim 8 wherein the second fan is adjusted to operate at a second substantially constant operating speed in response to the first fan becoming inoperable, the second constant operating speed being higher than the first constant operating speed.

11. The system of claim 10, wherein the first constant operating speed is approximately one-half of the second constant operating speed.

12. The system of claim 9 wherein the first speed sensing device and the voltage controller are connected to the second fan, and the second speed sensing device is connected to the first fan.

13. The system of claim 12 wherein the second fan speed is adjusted to a speed level higher than the constant speed of the first fan.

14. The system of claim 1 wherein the speed differential is approximately 3%.

15. The system of claim 1 wherein the speed differential is between about 2% and about 10%.

16. The system of claim 1 wherein the first fan and the second fan are positioned to direct the stream of air in a common air flow direction along a common airflow axis.

17. The system of claim 1, further comprising:
a fan housing having the fans removably mounted in a side-by-side series configuration therein.

18. A computer system comprising:
a chassis;
a microprocessor mounted on the chassis;
a system memory coupled to provide storage to facilitate execution of computer programs by the microprocessor;
an input coupled to provide input to the microprocessor;
a display coupled to a video controller;
a mass storage coupled to the microprocessor;
a first fan mounted in the chassis for moving a stream of air;
a second fan mounted adjacent the first fan for moving the stream of air;
a constant speed controller electrically connected to one of the first and second fans;
an adjustable speed controller including a first speed sensing device and a voltage controller electrically connected to one of the first and second fans, and a second speed sensing device electrically connected to the other of the first and second fans; and
a speed differential between the first and second fans being maintained in response to adjusting voltage supplied to one of the first and second fans such that one of the fans, being in an upstream position relative to the stream of air, is speed adjusted to a speed level higher than the other of the fans.

19. A method of operating a plurality of series mounted fans, comprising:
mounting a first in a chassis for moving a stream of air;
mounting a second fan adjacent the first fan for moving the stream of air;
electrically connecting a constant speed controller to one of the first and second fans;
electrically connecting an adjustable speed controller including a first speed sensing device and a voltage controller to one of the first and second fans, and electrically connecting a second speed sensing device to the other of the first and second fans; and
maintaining a speed differential between the first and second fans in response to adjusting voltage supplied to one of the first and second fans so that one of the fans, being in an upstream position relative to the stream of air, is speed adjusted to a speed level higher than the other of the fans.

* * * * *